(12) United States Patent
Benevit et al.

(10) Patent No.: US 6,578,175 B1
(45) Date of Patent: Jun. 10, 2003

(54) METHOD AND APPARATUS FOR EVALUATING AND CORRECTING ERRORS IN INTEGRATED CIRCUIT CHIP DESIGNS

(75) Inventors: Carl A. Benevit, Whitehall, PA (US); Shane S. Dias, deceased, late of Allentown, PA (US), by John Anthony Pantone executor; John Anthony Pantone, Birdsboro, PA (US); Matthew M. Moucheron, Allentown, PA (US); John Michael Sharpe, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/434,961

(22) Filed: Nov. 5, 1999

(51) Int. Cl.$^7$ .................................................. G06F 17/50
(52) U.S. Cl. ............................. 716/2; 716/19; 382/146; 365/52
(58) Field of Search ............................ 716/2, 4, 8, 19, 716/20, 21; 382/146; 365/52

(56) References Cited

U.S. PATENT DOCUMENTS 6,108,229 A * 8/2000 Shau ............................ 365/52
6,278,797 B1 * 8/2001 Nagasaki et al. ............. 382/146

* cited by examiner

Primary Examiner—Matthew Smith
Assistant Examiner—Thuan Do
(74) Attorney, Agent, or Firm—Steve Mendelsohn

(57) ABSTRACT

A process for evaluating and correcting virtual integrated circuit designs includes a method and apparatus for determining a ratio of an amount of material, i.e. polysilicon or metal, in any given layer to an area of the layer. The ratio is then compared to a predetermined target ratio, which is based on a ratio of the total amount of the material to the entire area of the I-C design. The process then automatically inserts or deletes an amount of material from the layer as needed, using any of four methods. These methods include deletion, scaling, deletion and scaling or striping. The ratio for an erroneous layer is rechecked after the first correction is performed and the entire process is repeated using a Newton-Raphson or a Least Absolute Deviation Regression method until the ratio falls within the predetermined tolerances. If the layer has been filled, the layer is further checked for short circuits, fill isolation violations, antenna violations and the like which may have resulted from the material fill. The evaluation and correction process proceeds for each layer of the virtual integrated circuit design until the entire design has been evaluated and corrected.

27 Claims, 6 Drawing Sheets

METHOD AND APPARATUS FOR EVALUATING AND CORRECTING ERRORS IN INTEGRATED CIRCUIT CHIP DESIGNS

BACKGROUND OF THE INVENTION

1. Field of the Invention

The present invention relates to electrical computers and digital processing systems for instruction processing, and relates more particularly to specialized instruction processing in support of testing, debugging and emulation of integrated-circuit chip designs stored on a computer.

2. Description of the Related Art

Computer-aided design (CAD) programs are widely used in the field of integrated-circuit (I-C) chip design. Many CAD programs, such as the CADENCE suite of programs by CADENCE DESIGN SYSTEMS, INC., allow designers to input a multitude of design parameters for a propose d I-C chip in order to achieve a desired functionality. A typical process for the conception, design and manufacture of an I-C chip is described as follows.

As an initial step in the design process, a proposed functionality for an I-C chip is presented to and analyzed by one or more chip designers. The designers then determine the logical components that may be required to achieve the desired functionality. The designers next place the components in a virtual layout using a computer workstation, such as those commonly manufactured by SUN MICROSYSTEMS, in conjunction with logic design tools provided by a CAD program which may run thereon.

Designers generally employ hierarchical design techniques to determine the appropriate selection and interconnection of logic and/or electrical components which will enable the chip to perform with the desired functionality. These techniques involve describing the chip's functionality at various levels, ranging from the most general function performed by the chip to the precise functions performed by each logic or electrical component placed in the virtual layout. Each of the multiple levels of a proposed I-C chip design are typically specified in the virtual layout.

A final virtual I-C layout will describe multiple layers of a physical I-C chip wherein a substrate forms the base layer with varying amounts of polysilicon and or/or metal. Metal layers are then stacked with alternating layers of dielectric material between each layer. "Via" or "thrash" connections and contacts provide electrical communication between each layer. The levels described above may not always correspond one-to-one with each physical layer.

A common method for accomplishing the virtual I-C layout involves the use of a machine-readable hardware description language (HDL) which is employed by a CAD program. HDL languages often contain specific functions and syntax that allow complex hardware structures to be described in a compact and efficient way. Using an HDL also allows a designer to specify components of the I-C chip at any level. For example, the I-C chip may be defined as many individual small building blocks or cells. Alternatively, many or all such cells may be combined and stored as a single larger cell. Standard cells (for example, NAND gates, OR gates, flip-flops, multiplexors, and the like) are typically provided in a design library contained in the CAD program. Non-standard or user-defined cells may also be created, defined and stored by the designer in the design library.

Once the virtual I-C layout is completed, it is typically stored in a database format so that the logical and functional relationships of the components of the design can be simulated by the CAD program. One such database format is the DF II standard recognized by CAD programs such as CADENCE. If errors are detected during a simulation of the design, they are generally displayed to the designer on an output device, such as a monitor or printer. The errors are then fixed manually by the designer by rearranging, adding or deleting components of the I-C layout. The corrected I-C layout is then re-tested. These simulations are repeated in an iterative manner until the I-C layout produces satisfactory results, after which manufacturing of an I-C chip corresponding to the virtual layout can be commenced in any known manner.

Certain I-C chip designs typically contain varying amounts of polysilicon and metal. Regardless of any specific amounts used, it is well known in the art that a ratio of metal in a particular layer of a chip to the area of that layer should be within a certain tolerance of a target ratio which describes the total amount of metal on a chip to the entire area of the chip. The same applies for materials such as polysilicon. An appropriate target ratio for metal or polysilicon and the maximum deviation therefrom for a given I-C chip is usually application specific, rather than a fixed number. However, after the required ratios have been determined, if it is discovered that a ratio for any given layer of the chip falls outside that range, certain manufacturing problems may arise. These problems include localized hot spots, flaking, feature deformation, as well as other yield problems known to those of ordinary skill in the art. Thus, lack of uniform ratios are one type of error that must be checked for and corrected during the simulation of a virtual I-C chip layout.

CAD programs of the prior art provide a first error checking process which compares the ratio of metal or polysilicon for a given layer of a chip to that for a total area of the chip. Such programs further provide reports on those areas which violate a predetermined acceptable range of values. However, after such errors are displayed, the designer must revisit the chip design and correct the erroneous areas manually. To correct the errors for, say, an out-of-range metal ratio, the designer must insert metal fill in the affected area of chip when the ratio is below the required range, or delete metal fill from the affected area of the chip when the ratio exceeds the required range. After such insertion or deletion, the error-checking utility must be run again to determine whether the erroneous values have been properly corrected. This first error correction process must be repeated in an iterative manner until the ratio falls within the prescribed range, thus adding an inordinate amount of time and inefficiency to the I-C chip design process.

In addition, any metal fill inserted in a layer of the design as a result of the foregoing must be further re-checked in a violation checking process wherein it is determined whether short circuits, fill isolation violations, antenna violations and the like have resulted from such insertion. This second process must also be repeated in an iterative manner until any such unacceptable violations become negligible. This correction process, therefore, also adds an inordinate amount of time and inefficiency to the I-C chip design process.

As a result, there is a need for an automated apparatus and method for evaluating and correcting errors in integrated circuit chip designs which minimizes or eliminates the foregoing problems.

BRIEF SUMMARY OF THE INVENTION

In order to address and solve certain of the foregoing shortcomings in the prior art, the present invention provides a method and accompanying apparatus for evaluating and correcting a virtual integrated circuit design. The method comprises: (1) receiving a layout for an integrated circuit having a material covering a portion of an area thereof; (2) receiving a target ratio of the material to the area of the integrated circuit; (3) selecting a layer of the layout; (4) determining a material ratio of the material to an area of the selected layer; (5) comparing the material ratio to the target ratio; and (6) adjusting an amount of the material in the layer based on the comparing step.

The adjusting step may include adjusting a material based on an only deletion method, an only scaling method, a combined deletion and scaling method and a striping method. The method and apparatus of the present invention further allows for the automatic detection and correction of violations, such as fill isolation violations, antenna violations, short circuits, and the like which result from the adjusted material.

It is therefore an advantage of the present invention that error checking and correcting processes are performed automatically by a computer, thereby saving time in the design and manufacture of, for example, integrated circuit chips.

BRIEF DESCRIPTION OF THE SEVERAL VIEWS OF THE DRAWINGS

Further aspects of the instant invention will be more readily appreciated upon review of the detailed description of the preferred embodiments included below when taken in conjunction with the accompanying drawings, of which.

DETAILED DESCRIPTION OF THE INVENTION

Referring now to FIGS. 1 through 6, wherein similar components of the instant invention are referenced in like manner, a preferred apparatus for evaluating and correcting errors in virtual I-C designs and accompanying methods for using the same are disclosed.

Figure 1:
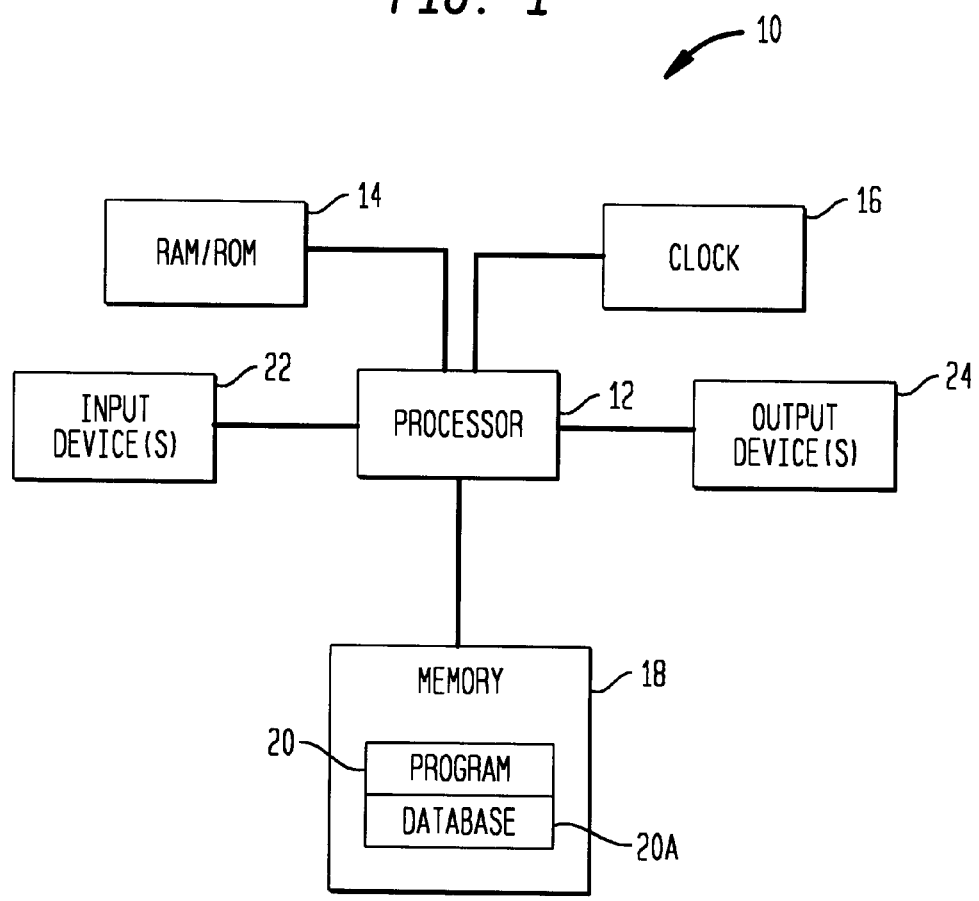
FIG. 1 is a schematic diagram of a processing system used for error checking in accordance with the present invention.

Turning now to FIG. 1, depicted therein is a computer workstation 10, such as the SUNSPARC workstation manufactured by SUN MICROSYSTEMS. Workstation 10 is operative to receive program instructions and user inputs, and is further operative to output results corresponding to such instructions and inputs in accordance with the present invention. Workstation 10 preferably includes a processor 12 which may be any commonly available microprocessor, and may be of the kind utilized by UNIX workstations manufactured by SUN. Processor 12 is operatively connected to RAM/ROM 14, clock 16, memory 18 (which stores program 20), input device(s) 22 and output device(s) 24.

The random-access memory (RAM) portion of RAM/ROM 14 may be a suitable number of Single In-line Memory Module (SIMM) chips having a storage capacity (typically measured in kilobytes or megabytes) sufficient to store and transfer, inter alia, processing instructions utilized by processor 12 and received from program 20 during operation of workstation 10. The read-only memory (ROM) portion of RAM/ROM 14 may be any permanent non-rewritable memory medium capable of storing and transferring, inter alia, processing instructions performed by processor 12 during a start-up routine of workstation 10. Further functions of RAM/ROM 14 will be apparent to one of ordinary skill in the art.

Clock 16 may be an on-board component of processor 12, or a separate component, which dictates a clock speed (typically measured in MHz) at which processor 12 performs and synchronizes, inter alia, communication between hardware components of workstation 10. Further functions of clock 16 will be apparent to one of ordinary skill in the art.

Input device(s) 22 may be one or more commonly known devices used for communicating information to workstation 10 from another computer workstation or a user of the workstation 10. Input device(s) 22 are preferably used for receiving design information and other instructions from a user, such as an I-C chip designer Accordingly, input device(s) 22 may include a keyboard, a mouse, a graphics tablet, a scanner, a voice recognition unit, a parallel or serial communication port, a network connection and any appropriate network or other communication card for receiving data.

Output device(s) 24 may be one or more commonly known devices used by workstation 10 to communicate the results of input instructions and values to a user of workstation 10. Output device(s) 24 are preferably used for giving audio and/or visual feedback concerning the design to the designer while a virtual chip layout is being constructed. Accordingly, output device(s) 24 may include a display monitor, a voice synthesizer, a printer, a parallel or serial communication port, a network connection and any appropriate network or other communication card for transmitting or displaying data.

Memory 18 may be any internal or external large capacity electronic data storage device, the storage capacity of which is typically measured in megabytes or gigabytes. Memory 18 stores, inter alia, an operating system such as a UNIX operating system of the type found in SUNSPARC workstations manufactured by SUN MICROSYSTEMS. Memory 18 further stores one or more application programs, such as program 20 described further herein below. Accordingly, memory 18 may be one or more of the following: a floppy disk drive and a floppy disk, a hard disk drive, a memory chip, a CD-ROM disk and reader/writer, a DVD disk and reader/writer, a ZIP disk and a ZIP drive of the type manufactured by IOMEGA CORP., and/or any other computer readable medium that may be encoded with processing instructions in a read-only or read-write format. Further functions of and available devices for memory 18 will be apparent to one of ordinary skill in the art.

Program 20 includes a plurality of processing instructions which enables workstation 10 to process data and information in accordance with the present invention. Program 20 may be written in any conventional computer language that is comprehensible to workstation 10, such as C++ and may include a database 20a, such as a DF II compatible database. In one embodiment of the instant invention, program 20 is a suite of CAD programs such as CADENCE which would incorporate the instant invention. In a second embodiment, program 20 is a separate program incorporating the instant invention and which may run in conjunction with a general CAD program.

Figure 2:
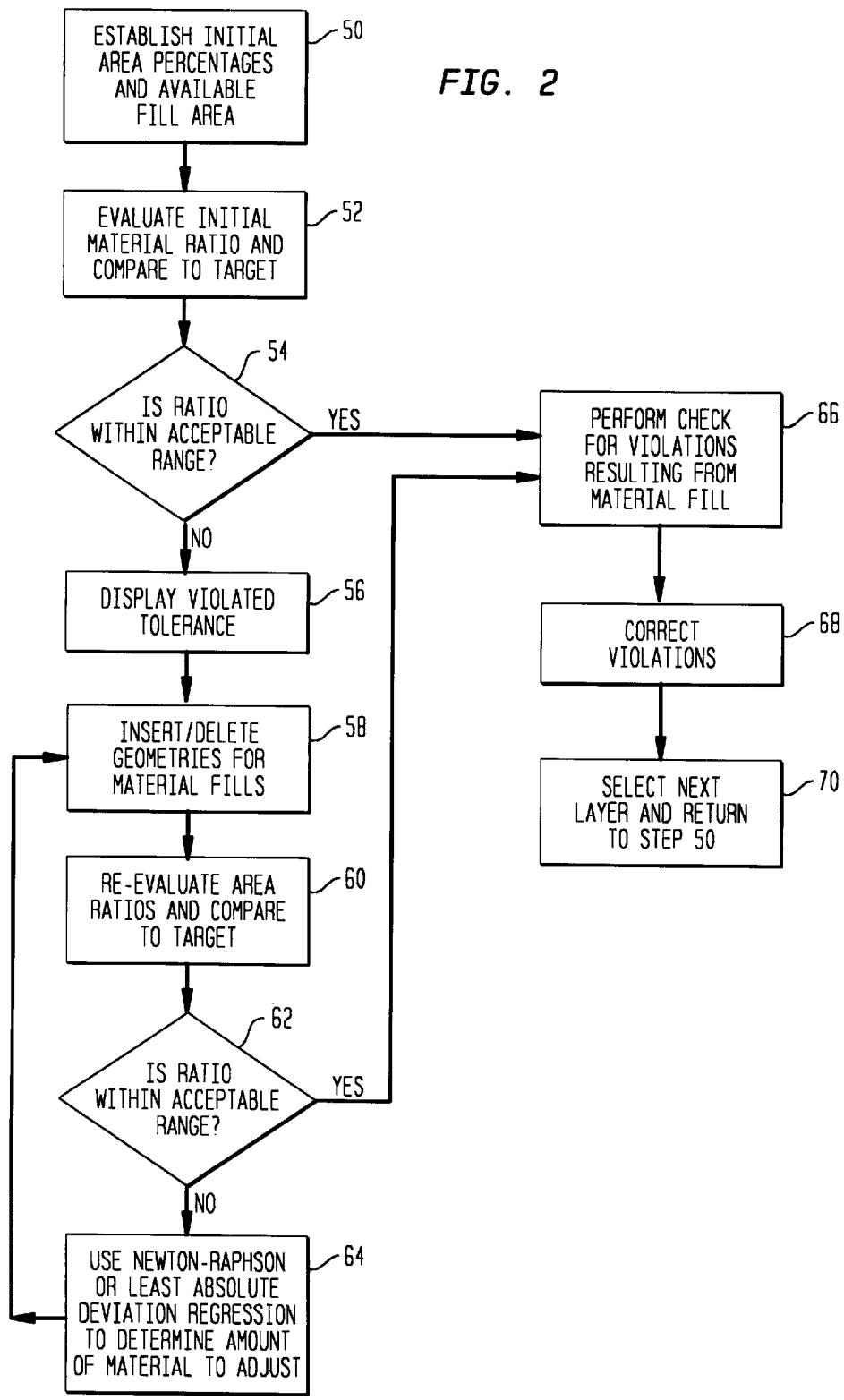
FIG. 2 is a flowchart illustrating the operation of an embodiment of an error checking and correction method of the present invention.
Figure 3:
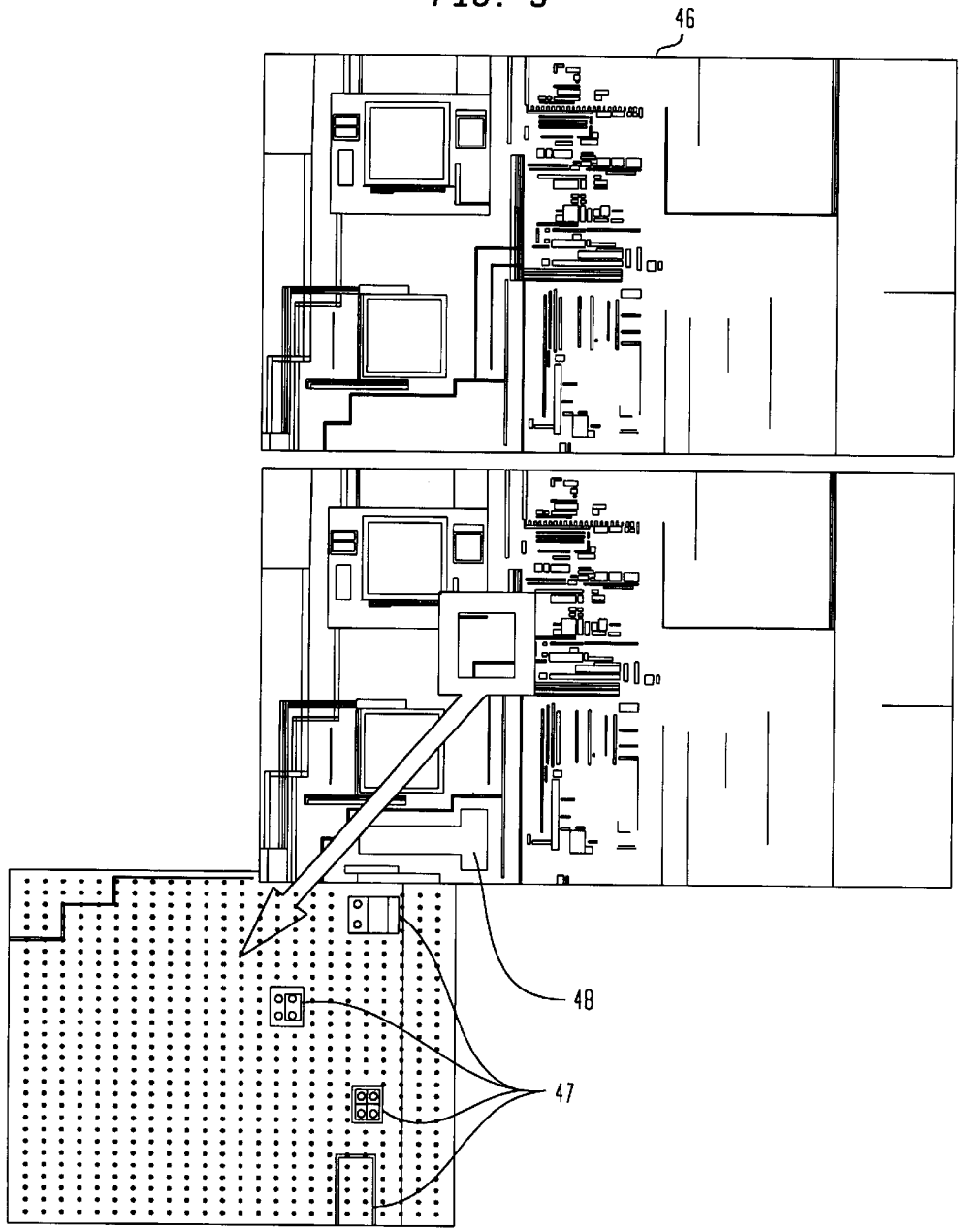
FIG. 3 is an illustration of an exemplary virtual integrated circuit layout subject to the error checking and correction method of the present invention.
Figure 4:
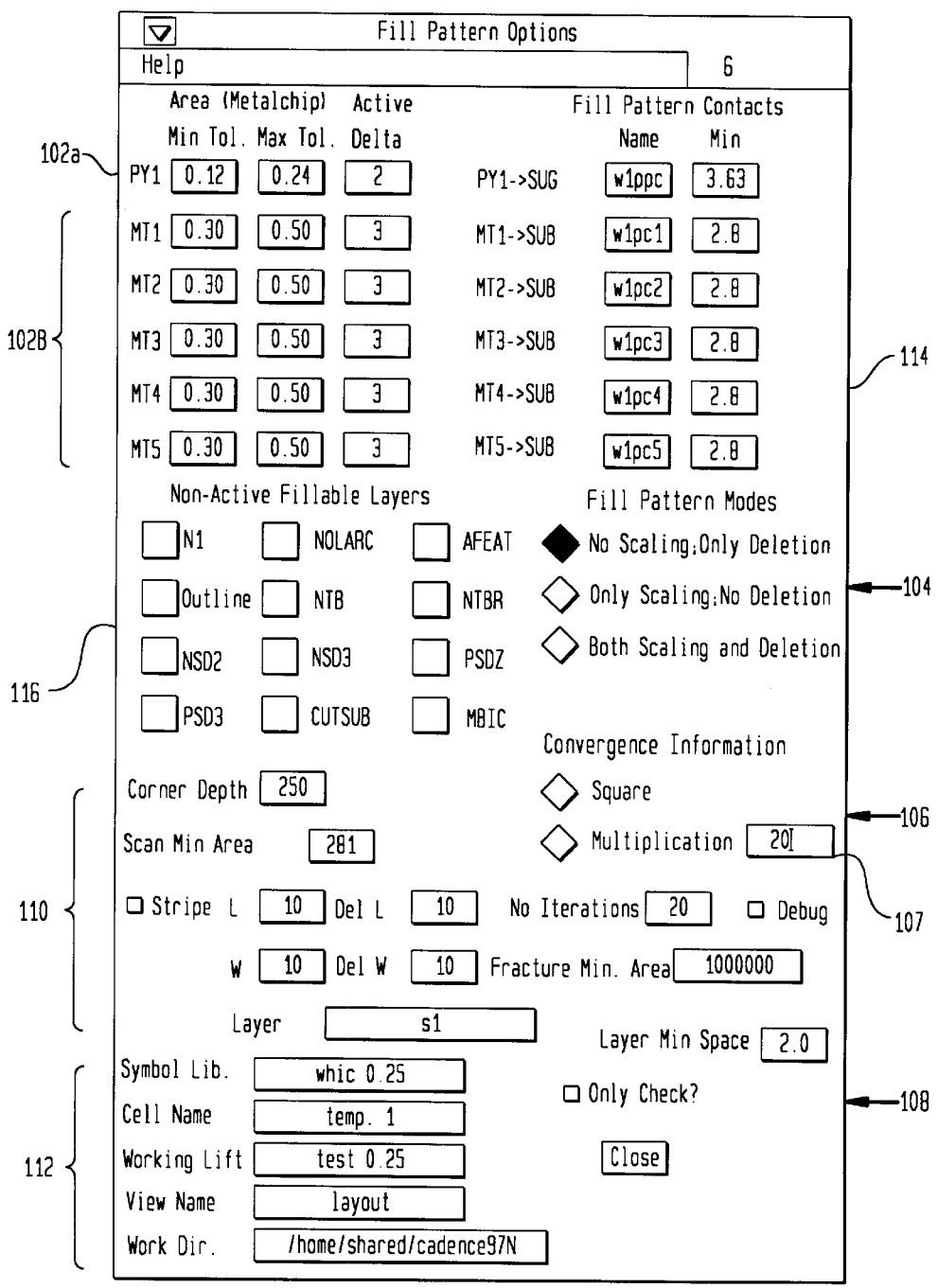
FIG. 4 is an illustration of an exemplary dialog box presented to a designer to initiate the error checking and correction method of the present invention.
Figure 5:
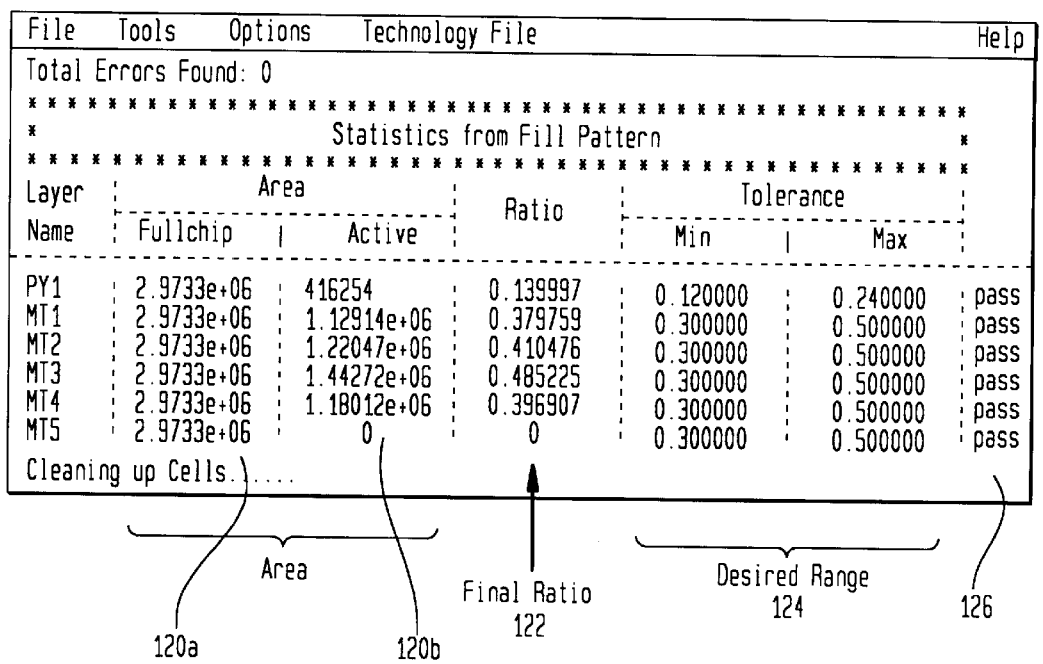
FIG. 5 is an illustration of an exemplary dialog box presenting to a designer a report of the results of the error checking method of the present invention.

One preferred embodiment of the functionality of program 20 is displayed in FIG. 2, with continuing reference to the features of FIGS. 3–5. After program 20 has been activated on workstation 10 in the manner of any typical computer program, program 20 proceeds to step 50 wherein an initial layer 48 of an input virtual integrated circuit design 46 is selected for analysis. The initial layer 48 may be selected by the program as described below, or it may be selected by a user of workstation 10 in any conventional manner. When initial layer 48 is selected by program 20, such selection may be based on the physical attributes of the layer. For example, the initial layer 48 may be selected based on the area 120b (as displayed in FIG. 5), size, shape, amount of material present in the layer, the level of the design in which the layer appears or any other physical attribute recognizable by program 20. Once initial layer 48 has been selected, program 20 determines the area 120b of the layer 48, an amount of material, i.e. metal or polysilicon, in the layer 48 and an available area 39 of layer 48 which may accept material fill.

At step 52, program 20 determines the ratio 122 (see FIG. 5) of an amount of a material to the area 120b of layer 48 which is then compared to a predetermined target ratio 124 relating the total amount of the material to the total area (120a) of virtual integrated circuit design 46. The predetermined target ratio 124 may be entered by a user and stored by program 20, or program 20 may actually measure the target ratio 124 after the virtual integrated circuit design 46 has been entered into workstation 10. The predetermined target ratio 124 may be expressed as a single number or may be expressed as a range of acceptable values.

At step 54, program 20 determines whether the ratio 122 for the layer 48 compares favorably with the predetermined target ratio 124. For example, program 20 may determine whether the material ratio 122 falls within the range of acceptable values for the target ratio 124. Alternatively, program 20 may only find that the ratios compare favorably when the material ratio 122 equals a single-value total ratio (not shown). If the material ratio 122 is within an acceptable tolerance of the target ratio 124, program 20 proceeds directly to step 66, discussed later hereinbelow. If the ratios do not compare favorably, program 20 proceeds to a main iteration loop which begins at step 56 as described immediately below.

At step 56, program 20 displays any erroneous material ratios 122 to a user, such as is depicted in dialog box 118 of FIG. 5. Program 20 next proceeds to step 58 wherein material fill of the same type analyzed is inserted or deleted in accordance with the comparison. In other words, if the material ratio 122 is lower than the total ratio 124, material fill may be added by program 20 to the layer 48. If the material ratio 122 is higher than the total ratio 124, material fill may be deleted by program 20 from layer 48. The insertion and deletion of material fill is accomplished through one of four mathematical functions 104 described immediately below. However other functions may be used as will be apparent to one of ordinary skill in the art.

The first of these mathematical functions 104 is referred to herein as an "only deletion" function. With this method, when a material ratio 122 is low, the entire area available for metal fill, determined in step 50, is filled with material by program 20. Also according to this method, when a material ratio 122 is too high, geometric shapes, i.e. polygons, of the material in layer 48 which exceed a predefined size are each eliminated from layer 48

A second mathematical function 104 which may be employed by program 20 is an "only scaling" function. With this second method, when a material ratio 122 either exceeds or is less than the total ratio 124, all material fill shapes within the layer 48 are decreased or increased, respectively, by a convergence function described further herein below.

A third mathematical function 104 is referred to herein as a "both scaling and deletion" function. The "both scaling and deleting" function is the preferred method for accomplishing correction of a virtual integrated circuit design. According to this third method, aspects of the only deletion and only scaling functions are combined. For example, if it is determined that material fill needs to be deleted from the layer 48, program 20 will delete geometric features which are smaller than a predetermined threshold (e.g. 100,000 square microns) and will scale those features which exceed the predetermined threshold.

A fourth mathematical function 104 is referred to herein as a "striping" function. According to this fourth method, the layer 48 is subdivided into a series of smaller regions or stripes which are of a size which statistically decrease the possibility that material fill added or deleted from such subdivided layers will result in antenna violations and the like, which are described further hereinbelow with regard to step 66. For example, when material fill needs to be added to the layer 48, in accordance with the results of step 54, such subdivided layers may be filled with geometric material fill features 38 (See FIG. 6) to a predetermined threshold (e.g. 10,000 square microns) without such violations later occurring in the design. Thus, this fourth function has the advantage of correcting metal fill problems while eliminating the possibility of incurring antenna violations and the like.

Any of the preceding four methods may be selected by a user during the operation of program 20 by, for example, checking an appropriate box in the mathematical functions section 104 of dialog box 100, as displayed in FIG. 4. Alternatively, program 20 may be programmed to automatically select one or more of the appropriate functions or an alternative function in accordance with this invention.

After the appropriate mathematical function 104 has been selected, program 20 proceeds to step 58 wherein one or more of the above-described mathematical functions 104 is carried out and material fill is added or deleted as required. Program 20 then proceeds to step 60, wherein the material ratio 122 for layer 48 is measured again and compared to the target ratio 144. If, in step 62, the material ratio 122 is found to be acceptable, the program proceeds to step 66, described further herein below. If, in step 62, the material ratio 122 is not found to be acceptable after this round of correction and one of the scaling functions has been used, the program proceeds to step 64, described immediately below. Otherwise, program 62 returns to step 56, wherein steps 56–64 are repeated in an iterative manner until the material ratio 122 is within the required tolerance 124.

When a scaling function has been employed in the preceding steps, it has been determined through experimentation that such scaling functions tend to overcompensate for the amount of material fill to be used in correcting the material ratio 124. Accordingly, at step 64, a convergence function may be used which adjusts the scaling factor for subsequent iterations of steps 58–62. Examples of appropriate convergence functions include a Newton-Raphson (e.g. a square) function or a Least Absolute Deviation Regression (e.g. a multiplication) function, each of which may be employed in any manner known to one of ordinary skill in the art. Furthermore, when a Least Absolute Deviation Regression method is selected, a relaxation number may be user-selected, as displayed for example as input 107 of dialog box 100, or may be selected by program 20. After step 64, program 20 returns to step 58 and proceeds in an iterative manner until material ratio 122 compares favorably to the target ratio 124.

After the iterative portion of program 20 has been completed and the material ratio 122 is correct, program 20 may proceed to step 66 wherein the material fill that has been added is analyzed to determine whether one or more other types of violations have resulted from a change in the amount of material fill. These violations include, but are not limited to: fill isolation violations, antenna violations, short circuits and the like. At step 68, any detected violations may be corrected by, for example, placing one or more steering diodes 47 between the material fill and a wafer of the integrated circuit design. Other corrections for such violations will be apparent to one of ordinary skill in the art.

After all violations have been corrected, program 20 selects a next layer for analysis and proceeds in accordance with the foregoing. Once all layers on a virtual integrated circuit design 46 have been checked, program 20 ends its operations and closes.

FIGS. 3–5 present exemplary features that may be displayed to a user of program 20. FIG. 3, as described above, presents an exemplary virtual integrated circuit design 46 which may have one or more levels. A layer 48 of the design 46 may be selected for analysis as hereinbefore described. Steering diodes 47 may be placed by the user or by program 20 to ground those sections of metal which may accumulate static charges and the like during plasma etching processes used during the manufacture of a physical I-C chip based on the virtual design.

FIG. 4 displays an exemplary dialog box 100 which presents fill pattern options to a user operating program 20. Dialog box 100 first provides a list of polysilicon layers 102a and metal layers 102b, as well as the allowable ratios 124 for each. Dialog box 100 further provides one or more mathematical functions 104 that may be optionally selectable by a user for use during an error checking and correction process as described with reference to FIG. 2.

Convergence options 106 may be provided to a user. Such options 106 includes whether to use a square or multiplication function in accordance with step 64. A user may also specify the maximum number of iterations that program 20 is to go through and a maximum area for features that can be scaled. Also, a user may specify a relaxation number 107 when a multiplication relaxation function is selected. As an alternative, these options may be predetermined by program 20 without opportunity for a user to specify them.

The following sections of dialog box 110 may be optionally provided and displayed to a user on output device(s) 24 prior to the operations program 20 discussed with regard to FIG. 2. Check option 108 may allow program 20 to be disabled for a selected cell or layer. Section 110 of dialog box 100 provides a user the opportunity to specify layers of virtual integrated circuit design 46 which may not be filled by program 20. Cell specification section 112 provides to the user the directory and file name information for a cell being operated on by program 20. Fill pattern contacts section 114 provides via contact information including a cell name and minimum dimension information for each via contact in virtual design 46. Non-active Fillable Layers Section 116 provides a list of non-active fillable layers that may be selected by a user for operation by program 20.

Turning now to FIG. 5, therein is depicted an optional dialog box 118 which presents to a user on output device(s) 24 a plurality of statistics for each material fill layer and the results of error checks performed on each layer by program 20. Such statistics include the total integrated circuit area 120a for virtual integrated circuit design 46, an active layer area 120b, a material ratio 122 for each material layer, a total acceptable ratio 124 for each material (which is depicted as a range of acceptable values) and an indication 126 as to whether each material layer passes or fails the ratio comparison in accordance with program 20.

Further dialog boxes (not shown) and the like may be provided for the violation check performed in steps 66 through 68 of program 20, as will be apparent to one of ordinary skill in the art.

Figure 6:
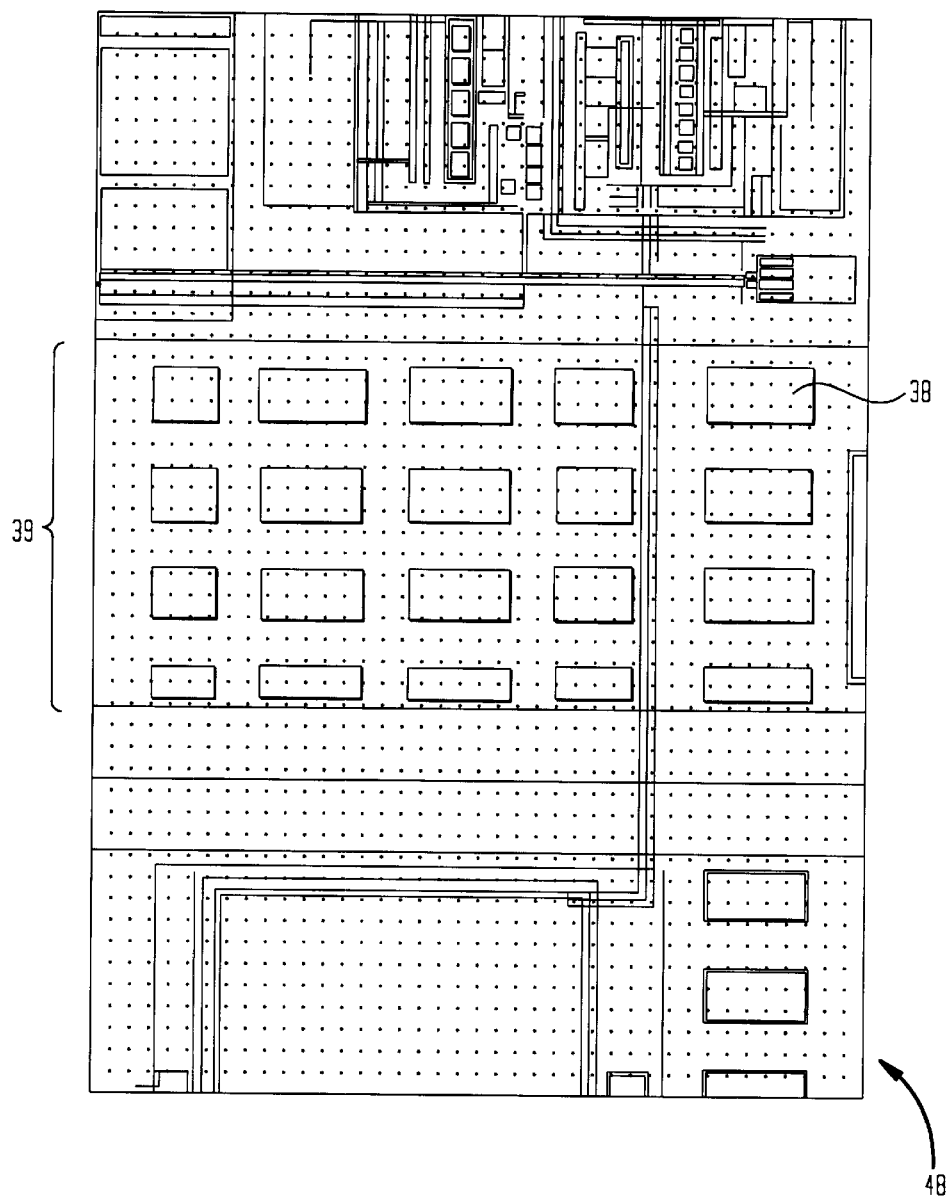
FIG. 6 is an illustration of exemplary material fill features added to a layer during a striping function performed in accordance with the instant invention.

FIG. 6 display a portion of the virtual integrated circuit design 48 which has an available area 39 for receiving metal fill. Geometric fill features 38 have been added to the available area 39 pursuant to one of the preceeding mathematical functions 104. In this example, program 20 has inserted an amount of material fill in a plurality of geometric features 38. Each feature may be, for example, ten microns by twenty microns in size so as to avoid antenna violations and the like.

Although the invention has been described in detail in the foregoing embodiments, it is to be understood that they have been provided for purposes of illustration only and that other variations both in form and detail can be made thereupon by those skilled in the art without departing from the spirit and scope of the invention, which is defined solely by the appended claims.

We claim:

1. A method, performed by a computer, for correcting a virtual integrated circuit design, comprising:
   receiving a layout for an integrated circuit having a material covering a portion of an area thereof;
   receiving a target ratio of the material to the area of the integrated circuit;
   selecting a layer of the layout;
   determining a material ratio of the material to an area of the selected layer;
   comparing the material ratio to the target ratio; and
   adjusting an amount of the material in the layer based on the comparing step.

2. The method of claim 1, wherein the material is polysilicon.

3. The method of claim 1, wherein the material is a metal.

4. The method of claim 1, wherein the integrated circuit comprises a total area.

5. The method of claim 4, wherein the target ratio comprises a total amount of the material divided by the total area.

6. The method of claim 1, wherein the selected layer has an area.

7. The method of claim 6, wherein the material ratio comprises an amount of the material in the layer divided by the area of the selected layer.

8. The method of claim 1, wherein the layer is selected by a user.

9. The method of claim 1, wherein the target ratio includes a range of acceptable values.

10. The method of claim 9, wherein the comparing step further comprises:

determining whether the material ratio is within the range of acceptable values.

11. The method of claim 10, wherein the adjusting step further comprises:

adding the amount of the material to the layer when the material ratio is less than the range of acceptable values.

12. The method of claim 10, wherein the adjusting step further comprises:

removing the amount of the material when the material ratio is greater than the range of acceptable values.

13. The method of claim 1, wherein the adjusting step further comprises:

adding the amount of the material to the layer when the material ratio is less than the target ratio.

14. The method of claim 1, wherein the adjusting step further comprises:

removing the amount of the material when the material ratio is greater than the target ratio.

15. The method of claim 1, wherein the adjusting step further comprises:

deleting a feature comprising the amount when the feature is a predetermined size.

16. The method of claim 1, wherein the adjusting step further comprises:

adjusting the amount of the material according to a predetermined scale.

17. The method of claim 16, further comprising:

selecting a convergence function to select the predetermined scale.

18. The method of claim 17, wherein the convergence function comprises at least one of:

a Newton-Raphson method and a Least Absolute Deviation Regression method.

19. The method of claim 1, wherein the adjusting step further comprises:

subdividing the layer into a plurality of smaller regions of a predetermined size; and adjusting the amount of the material in at least one of the plurality of smaller regions.

20. The method of claim 1, further comprising:

detecting whether an integrated circuit performance violation has occurred due to the adjusted amount; and correcting the violation.

21. The method of claim 20, wherein the integrated circuit performance violation comprises at least one of:

a fill isolation violation, an antenna violation and a short circuit.

22. The method of claim 1, wherein the determining, comparing and adjusting steps are repeated in an iterative manner after the adjusting step.

23. The method of claim 1, wherein the adjusting step is not performed when the material ratio is substantially equal to the target ratio.

24. The method of claim 1, further comprising:

displaying a result of the comparing step to a user.

25. An apparatus for correcting a virtual I-C chip design, comprising:

a processor; and a memory operatively connected to the processor, the memory for storing processing instructions operative to direct the processor to:

receiving a layout for an integrated circuit having a material covering a portion of an area thereof;

receive a target ratio of the material to the area of the integrated circuit;

select a layer of the layout;

determine a material ratio of the material to an area of the selected layer;

compare the material ratio to the target ratio; and adjust an amount of the material in the layer based on the comparing step.

26. A computer-readable medium encoded with processing instructions for directing a computer to perform a method for correcting a virtual integrated circuit design, the method comprising:

receiving a layout for an integrated circuit having a material covering a portion of an area thereof;

receiving a target ratio of the material to the area of the integrated circuit;

selecting a layer of the layout;

determining a material ratio of the material to an area of the selected layer;

comparing the material ratio to the target ratio; and adjusting an amount of the material in the layer based on the comparing step.

27. An apparatus for evaluating and correcting a virtual I-C chip design, comprising:

receiving a layout for an integrated circuit having a material covering a portion of an area thereof;

means for receiving a target ratio of the material to the area of the integrated circuit;

means for selecting a layer of the layout;

means for determining a material ratio of the material to an area of the selected layer;

means for comparing the material ratio to the target ratio; and means for adjusting an amount of the material in the layer based on the comparing step.

* * * * *